(12) United States Patent
Zhong et al.

(10) Patent No.: US 9,454,025 B2
(45) Date of Patent: Sep. 27, 2016

(54) DISPLAYS WITH REDUCED DRIVER CIRCUIT LEDGES

(75) Inventors: John Z. Zhong, Cupertino, CA (US); Cheng Chen, San Jose, CA (US); Shih-Chang Chang, Cupertino, CA (US); Victor H. Yin, Cupertino, CA (US); Shawn R. Gettemy, San Jose, CA (US); Wei Chen, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 51 days.

(21) Appl. No.: 13/600,862

(22) Filed: Aug. 31, 2012

(65) Prior Publication Data

US 2014/0063393 A1    Mar. 6, 2014

(51) Int. Cl.
*G02F 1/1345* (2006.01)
*G02F 1/133* (2006.01)

(52) U.S. Cl.
CPC ....... *G02F 1/13306* (2013.01); *G02F 1/13452* (2013.01); *G02F 2201/42* (2013.01)

(58) Field of Classification Search
CPC ............................ G02F 1/13306; G02F 1/133
USPC .......................................................... 349/42
See application file for complete search history.

(56) References Cited

U.S. PATENT DOCUMENTS

| 2,933,655 | A | 4/1960 | Gradisar et al. |
| 4,066,855 | A | 1/1978 | Zenk |
| 4,085,302 | A | 4/1978 | Zenk et al. |
| 4,431,270 | A | 2/1984 | Funada |
| 4,487,993 | A | 12/1984 | Becker |
| 4,549,174 | A | 10/1985 | Funada |
| 5,235,451 | A | 8/1993 | Bryan |
| 5,276,382 | A | 1/1994 | Stocker et al. |
| 5,436,744 | A * | 7/1995 | Arledge et al. ............... 349/150 |
| 5,483,261 | A | 1/1996 | Yasutake |
| 5,488,204 | A | 1/1996 | Mead et al. |
| 5,493,096 | A | 2/1996 | Koh |
| 5,577,205 | A | 11/1996 | Hwang et al. |

(Continued)

FOREIGN PATENT DOCUMENTS

| CN | 1912716 | 2/2007 |
| CN | 101430473 | 5/2009 |

(Continued)

OTHER PUBLICATIONS

Drzaic et al., U.S. Appl. No. 13/253,844, filed Oct. 5, 2011.

*Primary Examiner* — Paisley L Arendt
*Assistant Examiner* — Edmond Lau
(74) *Attorney, Agent, or Firm* — Treyz Law Group, P.C.; G. Victor Treyz; Zachary D. Hadd

(57) ABSTRACT

An electronic device display may have a color filter layer, a thin-film-transistor layer, and a layer of liquid crystal material. The display may have a display cover layer such as a layer of glass or plastic. Adhesive may be used to attach the upper polarizer to the display cover layer. The thin-film transistor layer may have a substrate with upper and lower surfaces. Thin-film-transistor circuitry may be formed on the upper surface. A display driver integrated circuit may be mounted to the lower surface or a flexible printed circuit and may be coupled to the thin-film-transistor circuitry using wire bonding wires. Through vias that are formed through the thin-film-transistor layer substrate may be used in coupling the thin-film-transistor circuitry to the display driver integrated circuit.

16 Claims, 8 Drawing Sheets

(56) References Cited

U.S. PATENT DOCUMENTS

| | | | |
|---|---|---|---|
| 5,592,199 A | 1/1997 | Kawaguchi | |
| 5,670,994 A | 9/1997 | Kawaguchi | |
| 5,825,352 A | 10/1998 | Bisset et al. | |
| 5,835,079 A | 11/1998 | Shieh | |
| 5,844,781 A | 12/1998 | Schlotterer et al. | |
| 5,880,411 A | 3/1999 | Gillespie et al. | |
| 5,880,705 A | 3/1999 | Onyskevych et al. | |
| 6,091,194 A | 7/2000 | Swirbel et al. | |
| 6,188,391 B1 | 2/2001 | Seely et al. | |
| 6,191,435 B1 | 2/2001 | Inoue | |
| 6,201,346 B1 | 3/2001 | Kusaka | |
| 6,239,982 B1 | 5/2001 | Bozzer et al. | |
| 6,310,610 B1 | 10/2001 | Beaton et al. | |
| 6,323,846 B1 | 11/2001 | Westerman et al. | |
| 6,421,033 B1 | 7/2002 | Williams et al. | |
| 6,498,592 B1 | 12/2002 | Matthies | |
| 6,560,117 B2 | 5/2003 | Moon | |
| 6,617,177 B1 | 9/2003 | Winer | |
| 6,690,387 B2 | 2/2004 | Zimmerman et al. | |
| 6,738,263 B2 | 5/2004 | Corisis et al. | |
| 6,774,872 B1* | 8/2004 | Kawada et al. | 345/60 |
| 6,801,174 B2 | 10/2004 | Kayama et al. | |
| 6,815,835 B2 | 11/2004 | James | |
| 7,015,894 B2 | 3/2006 | Morohoshi et al. | |
| 7,184,064 B2 | 2/2007 | Zimmerman et al. | |
| 7,211,738 B2 | 5/2007 | Lee et al. | |
| 7,245,500 B2 | 7/2007 | Khan et al. | |
| 7,342,354 B2 | 3/2008 | Utsunomiya et al. | |
| 7,417,867 B1 | 8/2008 | Matsuda et al. | |
| 7,663,607 B2 | 2/2010 | Hotelling | |
| 7,791,700 B2 | 9/2010 | Bellamy | |
| 7,796,397 B2 | 9/2010 | Yamauchi et al. | |
| 7,816,721 B2 | 10/2010 | Yamazaki et al. | |
| 7,864,136 B2 | 1/2011 | Matthies et al. | |
| 7,977,170 B2 | 7/2011 | Tredwell et al. | |
| 8,148,259 B2 | 4/2012 | Arai et al. | |
| 8,169,588 B2 | 5/2012 | Oikawa et al. | |
| 8,194,222 B2 | 6/2012 | Seki et al. | |
| 8,222,666 B2 | 7/2012 | Hatano et al. | |
| 8,253,914 B2 | 8/2012 | Kajiya et al. | |
| 8,258,523 B2 | 9/2012 | Lee et al. | |
| 8,269,923 B2 | 9/2012 | Yamagishi et al. | |
| 8,362,488 B2 | 1/2013 | Chaug et al. | |
| 8,395,722 B2 | 3/2013 | Mathew et al. | |
| 8,450,769 B2 | 5/2013 | Hatano et al. | |
| 8,456,586 B2 | 6/2013 | Mathew et al. | |
| 8,466,852 B2 | 6/2013 | Drzaic et al. | |
| 8,599,353 B2 | 12/2013 | Corrigan et al. | |
| 8,623,575 B2 | 1/2014 | Chen et al. | |
| 8,736,802 B2 | 5/2014 | Kajiya et al. | |
| 8,766,314 B2 | 7/2014 | Hatano et al. | |
| 8,766,858 B2 | 7/2014 | Li et al. | |
| 8,767,141 B2 | 7/2014 | Mathew et al. | |
| 8,804,347 B2 | 8/2014 | Martisauskas et al. | |
| 9,195,105 B2 | 11/2015 | Kajiya et al. | |
| 2001/0015788 A1 | 8/2001 | Mandal et al. | |
| 2002/0085158 A1* | 7/2002 | Armagost et al. | 349/149 |
| 2003/0011298 A1 | 1/2003 | Palanisamy | |
| 2003/0206331 A1 | 11/2003 | Chung et al. | |
| 2004/0016568 A1 | 1/2004 | Palanisamy | |
| 2004/0245924 A1 | 12/2004 | Ustunomiya et al. | |
| 2004/0263947 A1 | 12/2004 | Drzaic et al. | |
| 2005/0072597 A1 | 4/2005 | Lee et al. | |
| 2006/0026521 A1 | 2/2006 | Hotelling et al. | |
| 2006/0125995 A1 | 6/2006 | Tai et al. | |
| 2006/0197753 A1 | 9/2006 | Hotelling | |
| 2006/0231844 A1 | 10/2006 | Carter | |
| 2007/0002009 A1 | 1/2007 | Pasch et al. | |
| 2007/0019147 A1 | 1/2007 | Ryu | |
| 2007/0035679 A1 | 2/2007 | Lee et al. | |
| 2007/0063939 A1* | 3/2007 | Bellamy | 345/87 |
| 2007/0080360 A1 | 4/2007 | Mirsky et al. | |
| 2007/0148831 A1 | 6/2007 | Nagata et al. | |
| 2008/0024060 A1 | 1/2008 | Jonnalagadda et al. | |
| 2008/0035929 A1 | 2/2008 | Chen et al. | |
| 2008/0042180 A1 | 2/2008 | Yamazaki et al. | |
| 2008/0049408 A1 | 2/2008 | Yamauchi et al. | |
| 2008/0143913 A1 | 6/2008 | Lee et al. | |
| 2009/0027896 A1 | 1/2009 | Nishimura et al. | |
| 2009/0122653 A1 | 5/2009 | Seki | |
| 2009/0191670 A1 | 7/2009 | Heitzinger et al. | |
| 2009/0278452 A1 | 11/2009 | Kim | |
| 2009/0284688 A1 | 11/2009 | Shiraishi et al. | |
| 2010/0097551 A1 | 4/2010 | Yamagishi et al. | |
| 2010/0148209 A1 | 6/2010 | Hatano et al. | |
| 2010/0265225 A1* | 10/2010 | Han et al. | 345/206 |
| 2010/0315570 A1 | 12/2010 | Mathew et al. | |
| 2011/0012845 A1 | 1/2011 | Rothkopf et al. | |
| 2011/0109829 A1* | 5/2011 | Mathew et al. | 349/58 |
| 2011/0176199 A1* | 7/2011 | Sakurai et al. | 359/296 |
| 2011/0186345 A1 | 8/2011 | Pakula et al. | |
| 2011/0194063 A1* | 8/2011 | Lee et al. | 349/153 |
| 2011/0204403 A1 | 8/2011 | Kim et al. | |
| 2011/0292323 A1 | 12/2011 | Corrigan et al. | |
| 2011/0317120 A1* | 12/2011 | Kajiya | G02F 1/13452 349/149 |
| 2012/0009973 A1 | 1/2012 | Demuynck et al. | |
| 2012/0218502 A1 | 8/2012 | Seki | |
| 2012/0235969 A1 | 9/2012 | Burns et al. | |
| 2012/0242592 A1 | 9/2012 | Rothkopf et al. | |
| 2012/0273834 A1 | 11/2012 | Hatano et al. | |
| 2012/0287386 A1 | 11/2012 | Kijiya et al. | |
| 2012/0319304 A1 | 12/2012 | Pressel et al. | |
| 2012/0320319 A1 | 12/2012 | Chen et al. | |
| 2013/0002685 A1 | 1/2013 | Shenoy et al. | |
| 2013/0082984 A1 | 4/2013 | Drzaic et al. | |
| 2013/0088671 A1 | 4/2013 | Drzaic et al. | |
| 2013/0094126 A1 | 4/2013 | Rappoport et al. | |
| 2013/0107476 A1 | 5/2013 | Wright et al. | |
| 2013/0228785 A1 | 9/2013 | Hatano et al. | |
| 2013/0328051 A1 | 12/2013 | Franklin et al. | |
| 2013/0342099 A1 | 12/2013 | Weber et al. | |
| 2014/0049522 A1 | 2/2014 | Mathew et al. | |
| 2014/0138733 A1 | 5/2014 | Hatano et al. | |
| 2014/0254094 A1 | 9/2014 | Chang et al. | |
| 2014/0293210 A1 | 10/2014 | Kijiya et al. | |

FOREIGN PATENT DOCUMENTS

| | | |
|---|---|---|
| CN | 101636689 | 1/2010 |
| CN | 102187272 A | 9/2011 |
| EP | 0474508 | 3/1992 |
| EP | 2138892 | 12/2009 |
| EP | 2141573 | 6/2010 |
| EP | 2418537 | 2/2012 |
| JP | H05-142556 A | 6/1993 |
| JP | 10-261854 | 9/1998 |
| JP | 2000163031 | 6/2000 |
| JP | 2001-092381 | 4/2001 |
| JP | 2001215528 | 8/2001 |
| JP | 2002-040472 | 2/2002 |
| JP | 200293851 | 3/2002 |
| JP | 2002116454 | 4/2002 |
| JP | 2002-341785 A | 11/2002 |
| JP | 2002342033 | 11/2002 |
| JP | 2003058074 | 2/2003 |
| JP | 2003-255850 | 9/2003 |
| JP | 2003-337353 | 11/2003 |
| JP | 3593975 | 11/2004 |
| JP | 200549685 | 2/2005 |
| JP | 2007220569 | 8/2007 |
| JP | 2008-033094 | 2/2008 |
| JP | 2009-098451 A | 5/2009 |
| JP | 2009-229754 A | 10/2009 |
| JP | 2009-244338 | 10/2009 |
| JP | 2010-039211 A | 2/2010 |
| JP | 2011042531 | 3/2011 |
| KR | 10-2005-0093595 | 9/2005 |
| KR | 10-2010-005021 | 1/2010 |
| KR | 10/2011-0059629 | 6/2011 |
| KR | 10-2012-0020088 | 3/2012 |
| TW | 200521587 A | 7/2005 |
| TW | I297095 B | 5/2008 |
| TW | 200839356 | 10/2008 |

(56) References Cited

FOREIGN PATENT DOCUMENTS

| TW | 201001624 A | 1/2010 |
|---|---|---|
| WO | 2006106365 | 10/2006 |
| WO | 2008/114404 A | 9/2008 |
| WO | 2009089105 | 7/2009 |

* cited by examiner

DISPLAYS WITH REDUCED DRIVER CIRCUIT LEDGES

BACKGROUND

This relates generally to electronic devices, and more particularly, to electronic devices with displays.

Electronic devices often include displays. For example, cellular telephones and portable computers often include displays for presenting information to a user. An electronic device may have a housing such as a housing formed from plastic or metal. Components for the electronic device such as display components may be mounted in the housing.

It can be challenging to incorporate a display into the housing of an electronic device. Size and weight are often important considerations in designing electronic devices. If care is not taken, displays may be bulky or may be surrounded by overly large borders.

It would therefore be desirable to be able to provide improved displays for electronic devices.

SUMMARY

An electronic device may be provided with a display having upper and lower polarizers. The display may have a color filter layer, a thin-film-transistor layer, and a layer of liquid crystal material interposed between the color filter layer and the thin-film-transistor layer. The color filter layer and thin-film-transistor layer may be interposed between the upper and lower polarizers. The display may have a display cover layer such as a layer of glass or plastic. Adhesive may be used to attach the upper polarizer to the display cover layer.

The thin-film transistor layer may have a substrate such as a layer of glass with opposing upper and lower surfaces. Thin-film-transistor circuitry may be formed on the upper surface. A display driver integrated circuit may be mounted to the lower surface or may be mounted to a flexible printed circuit. Wire bonding wires may be used to couple the thin-film-transistor circuitry to a display driver integrated circuit on the lower surface or may be used to couple the thin-film-transistor circuitry to a flexible printed circuit to which a display driver integrated circuit has been mounted.

Through vias may be formed through the thin-film-transistor layer substrate. The through vias may be used in coupling a display driver integrated circuit to the thin-film transistor circuitry or may be used to couple the thin-film-transistor circuitry to a flexible printed circuit to which a display driver integrated circuit is mounted.

Further features of the invention, its nature and various advantages will be more apparent from the accompanying drawings and the following detailed description of the preferred embodiments.

DETAILED DESCRIPTION

Electronic devices may include displays. The displays may be used to display images to a user. Illustrative electronic devices that may be provided with displays are shown in FIGS. 1, 2, and 3.

Figure 1:
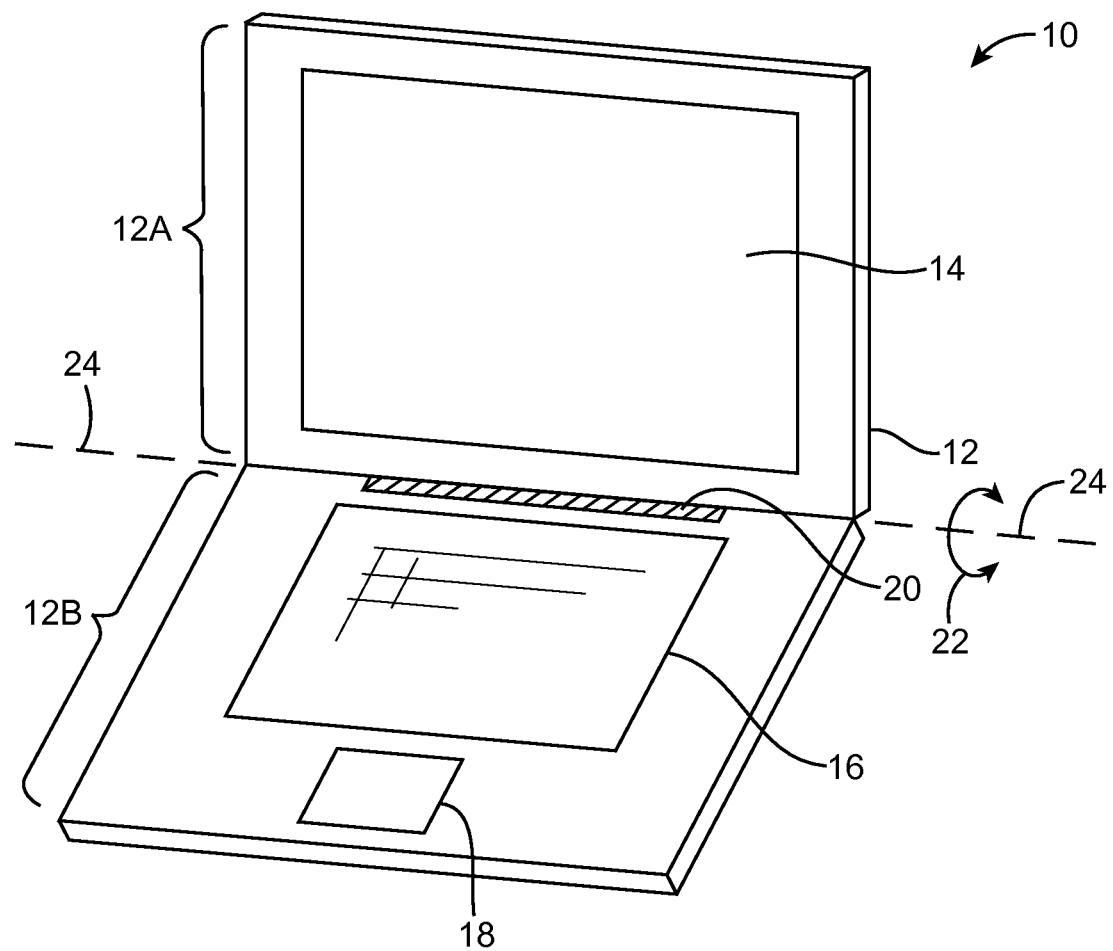
FIG. 1 is a perspective view of an illustrative electronic device such as a laptop computer with a display in accordance with an embodiment of the present invention.

FIG. 1 shows how electronic device 10 may have the shape of a laptop computer having upper housing 12A and lower housing 12B with components such as keyboard 16 and touchpad 18. Device 10 may have hinge structures 20 that allow upper housing 12A to rotate in directions 22 about rotational axis 24 relative to lower housing 12B. Display 14 may be mounted in upper housing 12A. Upper housing 12A, which may sometimes referred to as a display housing or lid, may be placed in a closed position by rotating upper housing 12A towards lower housing 12B about rotational axis 24.

Figure 2:
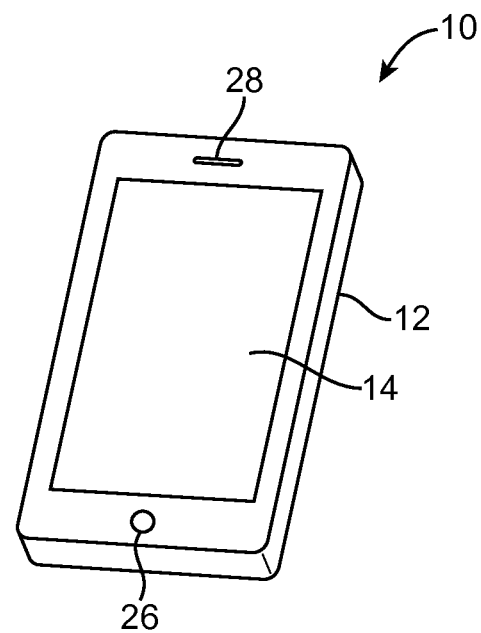
FIG. 2 is a perspective view of an illustrative electronic device such as a handheld electronic device with a display in accordance with an embodiment of the present invention.

FIG. 2 shows how electronic device 10 may be a handheld device such as a cellular telephone, music player, gaming device, navigation unit, or other compact device. In this type of configuration for device 10, housing 12 may have opposing front and rear surfaces. Display 14 may be mounted on a front face of housing 12. Display 14 may, if desired, have a display cover layer or other exterior layer that includes openings for components such as button 26. Openings may also be formed in a display cover layer or other display layer to accommodate a speaker port (see, e.g., speaker port 28 of FIG. 2).

Figure 3:
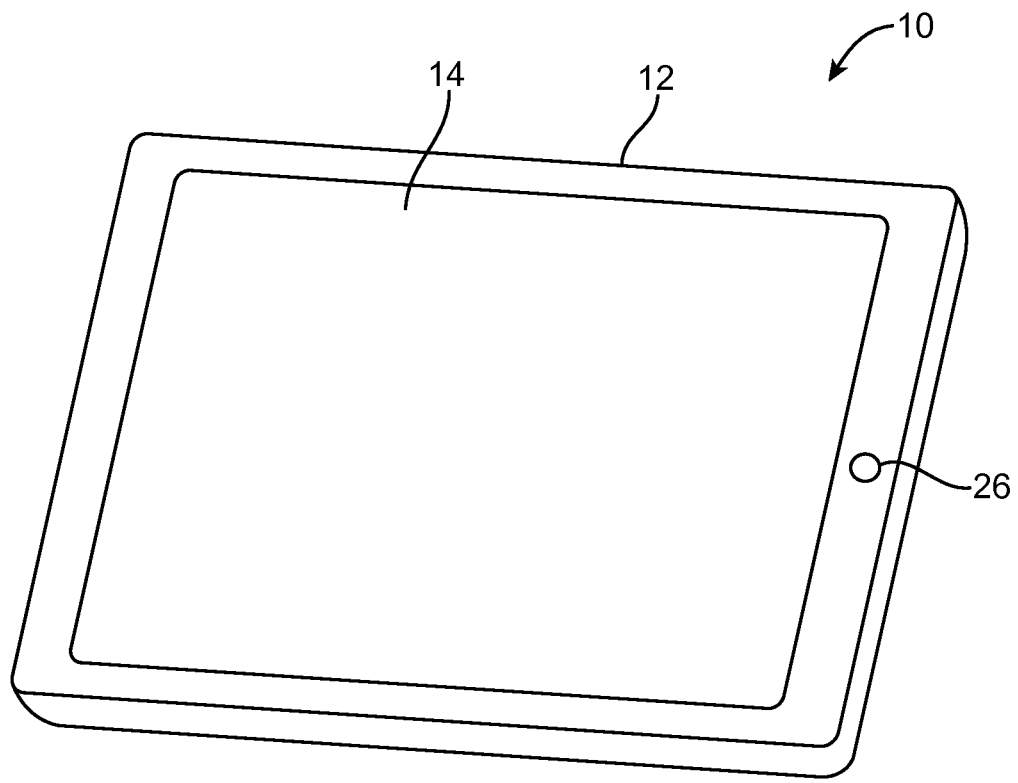
FIG. 3 is a perspective view of an illustrative electronic device such as a tablet computer with a display in accordance with an embodiment of the present invention.

FIG. 3 shows how electronic device 10 may be a tablet computer. In electronic device 10 of FIG. 3, housing 12 may have opposing planar front and rear surfaces. Display 14 may be mounted on the front surface of housing 12. As shown in FIG. 3, display 14 may have a cover layer or other external layer (e.g., a color filter layer or thin-film-transistor layer) with an opening to accommodate button 26 (as an example).

The illustrative configurations for device 10 that are shown in FIGS. 1, 2, and 3 are merely illustrative. In general, electronic device 10 may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Displays for device 10 may, in general, include image pixels formed from light-emitting diodes (LEDs), organic LEDs (OLEDs), plasma cells, electrowetting pixels, electrophoretic pixels, liquid crystal display (LCD) components, or other suitable image pixel structures. In some situations, it may be desirable to use LCD components to form display 14, so configurations for display 14 in which display 14 is a liquid crystal display are sometimes described herein as an example. It may also be desirable to provide displays such as display 14 with backlight structures, so configurations for display 14 that include a backlight unit may sometimes be described herein as an example. Other types of display technology may be used in device 10 if desired. The use of liquid crystal display structures and backlight structures in device 10 is merely illustrative.

A display cover layer may cover the surface of display 14 or a display layer such as a color filter layer, thin-film transistor layer or other portion of a display may be used as the outermost (or nearly outermost) layer in display 14. For example, a color filter layer or thin-film transistor layer that is covered by a polarizer layer may form the outermost layer for device 10. A display cover layer or other outer display layer may be formed from a transparent glass sheet, a clear plastic layer, or other transparent member.

Touch sensor components such as an array of capacitive touch sensor electrodes formed from transparent materials such as indium tin oxide may be formed on the underside of a display cover layer, may be formed on a separate display layer such as a glass or polymer touch sensor substrate, or may be integrated into other display layers (e.g., substrate layers such as a thin-film transistor layer).

Figure 4:
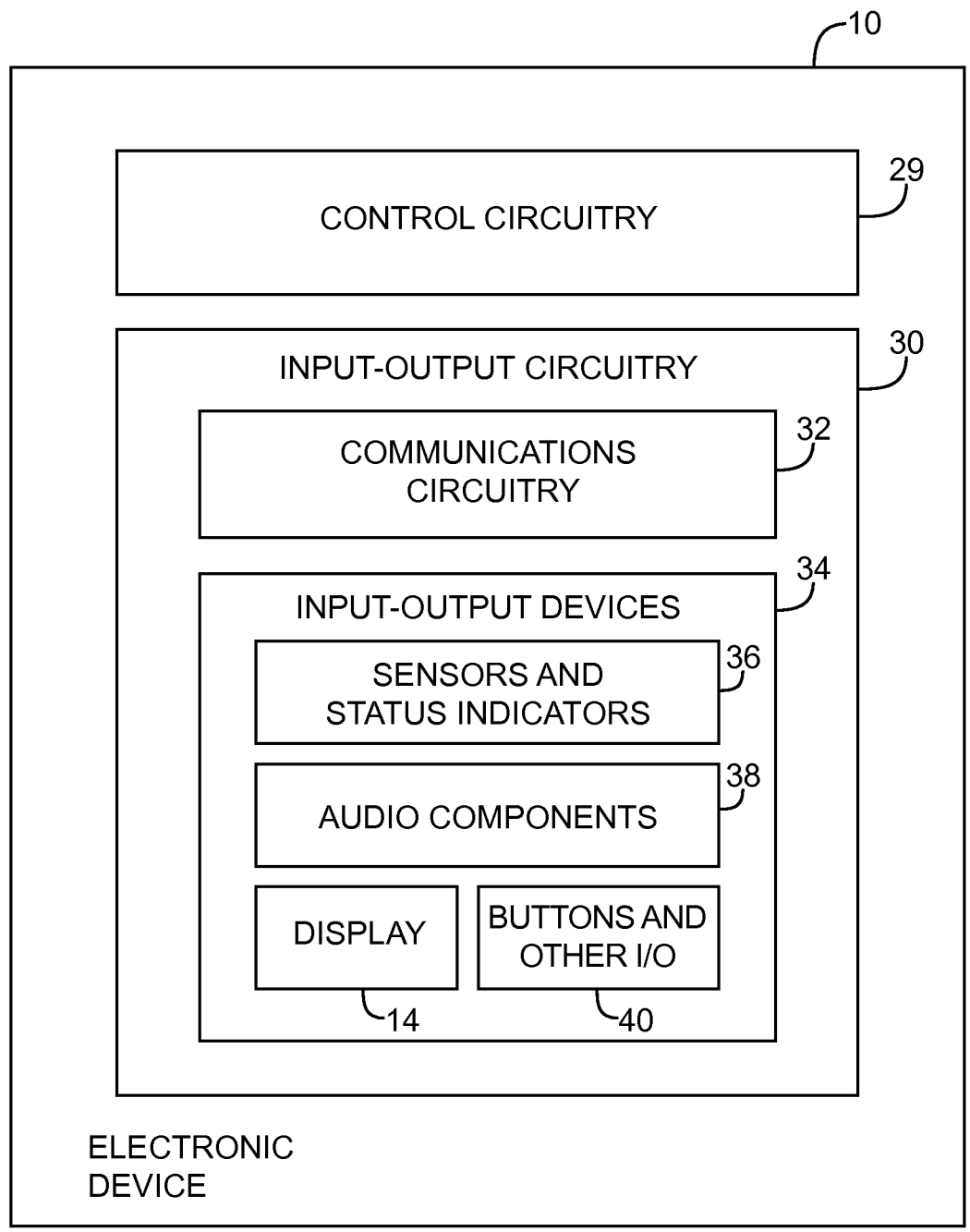
FIG. 4 is a schematic diagram of an illustrative electronic device with a display in accordance with an embodiment of the present invention.

A schematic diagram of an illustrative configuration that may be used for electronic device 10 is shown in FIG. 4. As shown in FIG. 4, electronic device 10 may include control circuitry 29. Control circuitry 29 may include storage and processing circuitry for controlling the operation of device 10. Control circuitry 29 may, for example, include storage such as hard disk drive storage, nonvolatile memory (e.g., flash memory or other electrically-programmable-read-only memory configured to form a solid state drive), volatile memory (e.g., static or dynamic random-access-memory), etc. Control circuitry 29 may include processing circuitry based on one or more microprocessors, microcontrollers, digital signal processors, baseband processors, power management units, audio codec chips, application specific integrated circuits, etc.

Control circuitry 29 may be used to run software on device 10, such as operating system software and application software. Using this software, control circuitry 29 may present information to a user of electronic device 10 on display 14. When presenting information to a user on display 14, sensor signals and other information may be used by control circuitry 29 in making adjustments to the strength of backlight illumination that is used for display 14.

Input-output circuitry 30 may be used to allow data to be supplied to device 10 and to allow data to be provided from device 10 to external devices. Input-output circuitry 30 may include communications circuitry 32. Communications circuitry 32 may include wired communications circuitry for supporting communications using data ports in device 10. Communications circuitry 32 may also include wireless communications circuits (e.g., circuitry for transmitting and receiving wireless radio-frequency signals using antennas).

Input-output circuitry 30 may also include input-output devices 34. A user can control the operation of device 10 by supplying commands through input-output devices 34 and may receive status information and other output from device 10 using the output resources of input-output devices 34.

Input-output devices 34 may include sensors and status indicators 36 such as an ambient light sensor, a proximity sensor, a temperature sensor, a pressure sensor, a magnetic sensor, an accelerometer, and light-emitting diodes and other components for gathering information about the environment in which device 10 is operating and providing information to a user of device 10 about the status of device 10.

Audio components 38 may include speakers and tone generators for presenting sound to a user of device 10 and microphones for gathering user audio input.

Display 14 may be used to present images for a user such as text, video, and still images. Sensors 36 may include a touch sensor array that is formed as one of the layers in display 14.

User input may be gathered using buttons and other input-output components 40 such as touch pad sensors, buttons, joysticks, click wheels, scrolling wheels, touch sensors such as sensors 36 in display 14, key pads, keyboards, vibrators, cameras, and other input-output components.

Figure 5:
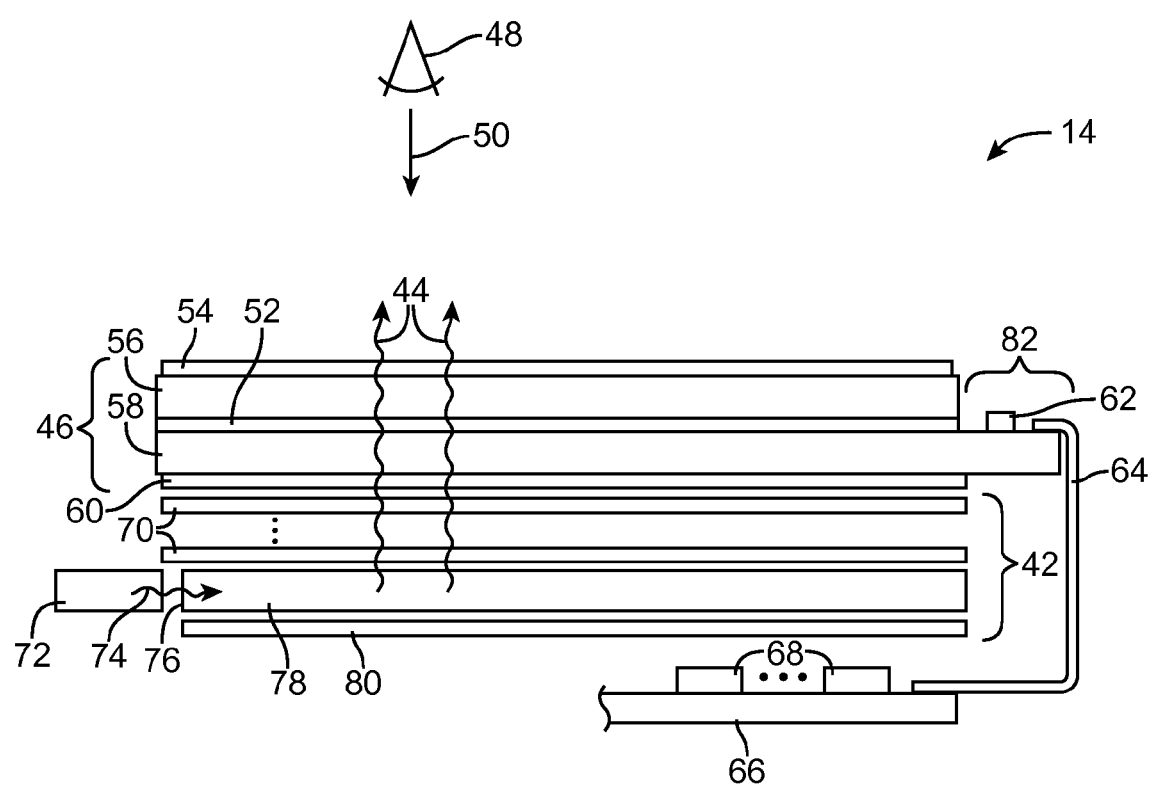
FIG. 5 is a cross-sectional side view of an illustrative display in accordance with an embodiment of the present invention.

A cross-sectional side view of an illustrative configuration that may be used for display 14 of device 10 (e.g., for display 14 of the devices of FIG. 1, FIG. 2, or FIG. 3 or other suitable electronic devices) is shown in FIG. 5. As shown in FIG. 5, display 14 may include backlight structures such as backlight unit 42 for producing backlight 44. During operation, backlight 44 travels outwards (vertically upwards in the orientation of FIG. 5) and passes through display pixel structures in display layers 46. This illuminates any images that are being produced by the display pixels for viewing by a user. For example, backlight 44 may illuminate images on display layers 46 that are being viewed by viewer 48 in direction 50.

Display layers 46 may be mounted in chassis structures such as a plastic chassis structure and/or a metal chassis structure to form a display module for mounting in housing 12 or display layers 46 may be mounted directly in housing 12 (e.g., by stacking display layers 46 into a recessed portion in housing 12). Display layers 46 may form a liquid crystal display or may be used in forming displays of other types.

In a configuration in which display layers 46 are used in forming a liquid crystal display, display layers 46 may include a liquid crystal layer such a liquid crystal layer 52. Liquid crystal layer 52 may be sandwiched between display layers such as display layers 58 and 56. Layers 56 and 58 may be interposed between lower polarizer layer 60 and upper polarizer layer 54.

Layers 58 and 56 may be formed from transparent substrate layers such as clear layers of glass or plastic. Layers 56 and 58 may be layers such as a thin-film transistor layer and/or a color filter layer. Conductive traces, color filter elements, transistors, and other circuits and structures may be formed on the substrates of layers 58 and 56 (e.g., to form a thin-film transistor layer and/or a color filter layer). Touch sensor electrodes may also be incorporated into layers such as layers 58 and 56 and/or touch sensor electrodes may be formed on other substrates.

With one illustrative configuration, layer 58 may be a thin-film transistor layer that includes an array of thin-film transistors and associated electrodes (display pixel electrodes) for applying electric fields to liquid crystal layer 52 and thereby displaying images on display 14. Layer 56 may be a color filter layer that includes an array of color filter elements for providing display 14 with the ability to display color images. If desired, the positions of color filter layer 56 and thin-film-transistor layer 58 may be inverted so that the thin-film-transistor layer is located above the color filter layer.

During operation of display 14 in device 10, control circuitry 29 (e.g., one or more integrated circuits such as components 68 on printed circuit 66 of FIG. 5) may be used to generate information to be displayed on display 14 (e.g., display data). The information to be displayed may be conveyed from circuitry 68 to display driver integrated circuit 62 using a signal path such as a signal path formed from conductive metal traces in flexible printed circuit 64 (as an example).

Display driver integrated circuit 62 may be mounted on thin-film-transistor layer driver ledge 82 or elsewhere in device 10. A flexible printed circuit cable such as flexible printed circuit 64 may be used in routing signals between printed circuit 66 and thin-film-transistor layer 60. If desired, display driver integrated circuit 62 may be mounted on printed circuit 66 or flexible printed circuit 64. Printed circuit 66 may be formed from a rigid printed circuit board (e.g., a layer of fiberglass-filled epoxy) or a flexible printed circuit (e.g., a flexible sheet of polyimide or other flexible polymer layer).

Backlight structures 42 may include a light guide plate such as light guide plate 78. Light guide plate 78 may be formed from a transparent material such as clear glass or plastic. During operation of backlight structures 42, a light source such as light source 72 may generate light 74. Light source 72 may be, for example, an array of light-emitting diodes.

Light 74 from light source 72 may be coupled into edge surface 76 of light guide plate 78 and may be distributed laterally throughout light guide plate 78 due to the principal of total internal reflection. Light guide plate 78 may include light-scattering features such as pits or bumps. The light-scattering features may be located on an upper surface and/or on an opposing lower surface of light guide plate 78.

Light 74 that scatters upwards from light guide plate 78 may serve as backlight 44 for display 14. Light 74 that scatters downwards may be reflected back in the upwards direction by reflector 80. Reflector 80 may be formed from a reflective material such as a layer of white plastic or other shiny materials.

To enhance backlight performance for backlight structures 42, backlight structures 42 may include optical films 70. Optical films 70 may include diffuser layers for helping to homogenize backlight 44 and thereby reduce hotspots, compensation films for enhancing off-axis viewing, and brightness enhancement films (also sometimes referred to as turning films) for collimating backlight 44. Optical films 70 may overlap the other structures in backlight unit 42 such as light guide plate 78 and reflector 80. For example, if light guide plate 78 has a rectangular footprint when viewed in direction 50 of FIG. 5 (i.e., when viewed as a top view), optical films 70 and reflector 80 may have a matching rectangular footprint.

Figure 6:
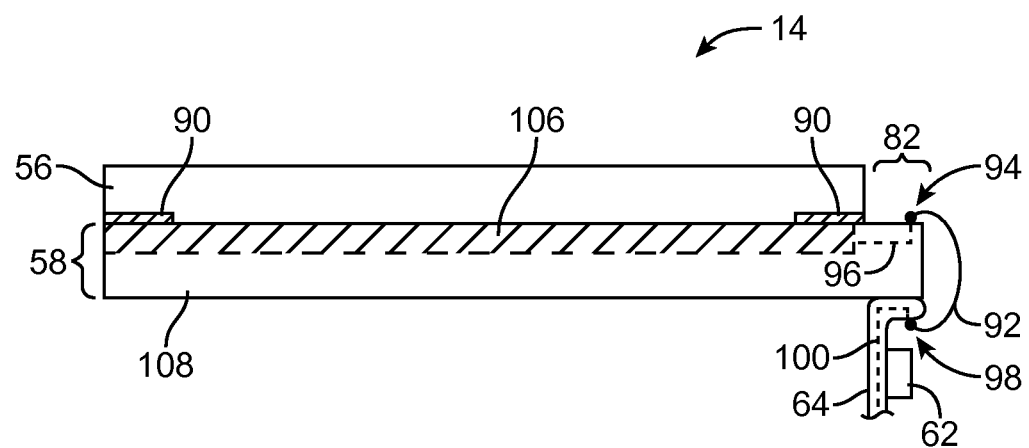
FIG. 6 is a cross-sectional side view of an illustrative display having wire bond connections that have been used to interconnect thin-film-transistor circuitry on the upper surface of a thin-film-transistor layer with flexible printed circuit structures on the lower surface of the thin-film transistor layer in accordance with an embodiment of the present invention.

FIG. 6 is a cross-sectional side view of an illustrative configuration that may be used for the structures of display 14 when it is desired to minimize the width of the inactive border region of the display 14. As shown in FIG. 6, display 14 may have a ledge such as ledge 82 on thin-film-transistor layer 58 (i.e., a portion of layer 58 that is uncovered by color filter layer 56). The size of ledge 82 of thin-film-transistor layer 58 may be minimized by mounting driver integrated circuit 62 on flexible printed circuit 64.

Thin-film-transistor layer 58 may include an array of display pixels. The display pixels may be controlled by signals that are routed over a grid of intersecting gate lines and data lines. Each display pixel may contain electrode structures for applying an electric field to an associated portion of liquid crystal layer 52. Thin-film transistors may be provided in the display pixels to control the electric fields that are applied by the electrode structures. The thin-film transistors, gate lines, data lines, other conductive lines, and other thin-film circuitry (e.g., gate line driver circuitry) formed on the upper surface of thin-film-transistor layer 58 is shown as thin-film-transistor circuitry 106 of FIG. 6.

Circuitry 106 may be formed on a substrate such as substrate 108. Substrate 108 may be formed from a sheet of clear glass or plastic or other transparent dielectric layer. Substrate 108 may have opposing planar upper and lower surfaces. Thin-film-circuitry 106 may be formed on the upper surface of substrate 108. Thin-film-circuitry 106 may include conductive lines such as conductive gate lines and data lines and other conductive lines that are used in distributing signals on thin-film-transistor layer 58. Conductive lines on thin-film-transistor layer 58 (e.g., metal traces or other conductive materials that are formed as part of thin-film-transistor circuitry 106 on the upper surface of thin-film-transistor substrate 108) are shown as lines 96 in FIG. 6.

Display driver integrated circuits such as display driver integrated circuit 62 of FIG. 6 may be mounted on substrates such as flexible printed circuit 64. Flexible printed circuit 64 may be attached to the lower surface of thin-film-transistor layer substrate 108 as shown in FIG. 6 or may be mounted to other support structures within device 10.

Flexible printed circuit 64 may include one or more layers of conductive lines 100 such as metal traces. Conductive lines 100 may serve as signal lines that distribute signals between display driver integrated circuit 62 and thin-film-transistor circuitry 106. Conductive lines 100 may include parallel signal paths that form a signal bus. Each of conductive lines 100 may be coupled to a respective signal path such as one of wire bond wires 92.

Each wire bonding wire 92 may have opposing first and second ends. The first end of each wire bonding wire 92 may be coupled to a respective one of traces 100 in flexible printed circuit 62 using a respective wire bond connection 98. The second end of each wire bonding wire 92 may be connected to a respective one of traces 96 in thin-film-transistor circuitry 106 on the upper surface of thin-film-transistor layer substrate 108. Wire bonding wires (wire bonds) 92 may be formed using a wire bonding tool. During wire bonding operations, the wire bonding head of the wire bonding tool and/or thin-film-transistor layer 58 may be positioned so that wire bonds 92 extend from the upper surface of thin-film-transistor layer 58 to the lower surface of thin-film transistor layer 58 (e.g., the exposed lower surface of flexible printed circuit layer 64).

Black masking material 90 may be formed around the inactive periphery (border) of display 14 between color filter layer 56 and thin-film-transistor layer 58. Black masking material 90, which may sometimes be referred to as opaque masking material, may be formed from a polymer containing carbon black or other material that absorbs visible light. Black masking material 90 may be patterned to form a strip that serves as an opaque border running around the rectangular periphery of display 14 overlapping inactive display components (e.g., display driver circuitry, a thin-film-transistor ledge, etc.) and helping to hide these components from view by a viewer such as viewer 48 of FIG. 5. Black masking material 90 may be deposited in a rectangular ring shape surrounding a central rectangular portion of display 14 that includes the display pixels for display 14.

Figure 7:
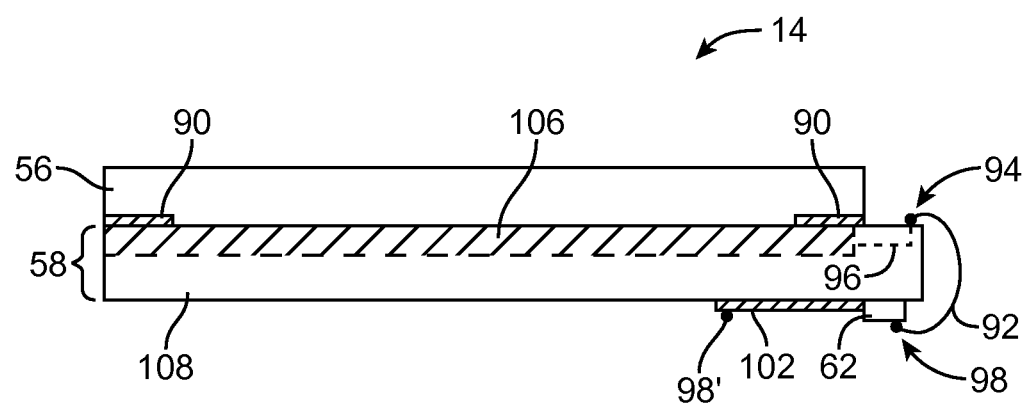
FIG. 7 is a cross-sectional side view of an illustrative display in which a driver integrated circuit has been mounted on the lower surface of a thin-film-transistor layer and in which wire bond connections have been used to connect thin-film-transistor circuitry on the upper surface of the thin-film-transistor layer to the driver integrated circuit in accordance with an embodiment of the present invention.

Another illustrative configuration that may be used in forming a display with a reduced inactive border region is shown in FIG. 7. As shown in FIG. 7, display driver circuitry such as one or more display driver integrated circuits 62 may be mounted on the lower surface of thin-film-transistor layer substrate 108. Conductive lines 102 may be formed on the lower surface of thin-film-transistor layer substrate 108 (e.g., to form pads to which a flexible printed circuit cable may be attached). Wire bonding wires 92 may be used to form connections with display driver integrated circuit 62 directly at connections such as wire bond connection 98 and/or may be used to form connections with display driver integrated circuitry 62 by forming a connection such as connection 98' with lower surface conductive lines 102. In configurations in which wire bonding wires 92 terminate on conductive lines 102, conductive lines 102 may be used to connect wires 92 to driver integrated circuit 62 (e.g., by using solder balls to flip-chip mount driver integrated circuit 62 to solder pads formed from conductive lines 102. Each wire bonding wire 92 may have a connection such as wire bond 94 of FIG. 7 with which that wire is connected to conductive lines on the upper surface of thin-film transistor layer 58.

Figure 8:
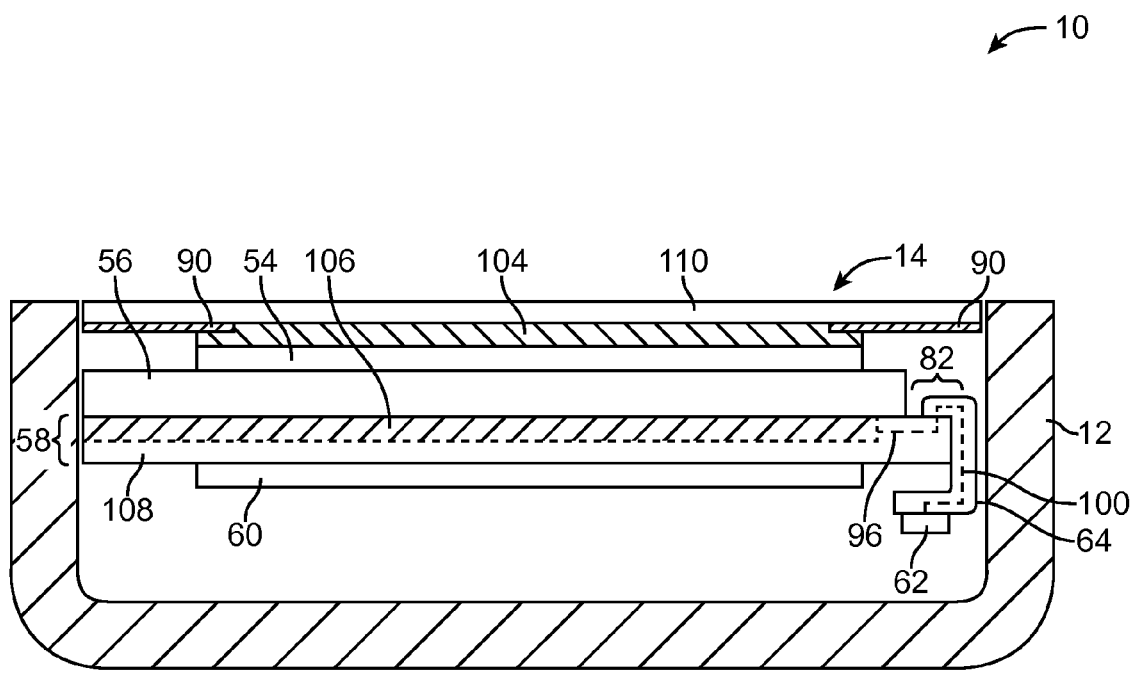
FIG. 8 is a cross-sectional side view of an illustrative electronic device having a display in which a flexible printed circuit bus is being used to connect a driver integrated circuit to traces on an upper surface of a thin-film-transistor layer and in which optically clear adhesive is being used to attach display layers to a cover glass layer in accordance with an embodiment of the present invention.

As shown in the cross-sectional side view of FIG. 8, another way in which the size of thin-film-transistor layer driver ledge 82 may be minimized involves mounting a display driver integrated circuit 62 on flexible printed circuit 64 (e.g., using solder or other connections between the circuitry of integrated circuit 62 and conductive lines 100) and using conductive lines 100 in flexible printed circuit 64 to route signals between display driver integrated circuit 62 and conductive lines 96 and other thin-film-transistor circuitry 106 on the upper surface of thin-film-transistor substrate layer 108. Traces 100 may be coupled to traces 96 using conductive adhesive (anisotropic conductive film), welds, solder connections, board-to-board connectors, or other attachment mechanisms. Because display driver integrated circuit 62 need not be located on ledge 82 of thin-film-transistor layer 58, the size of ledge 82 (and therefore the width of the inactive border portion of display 14 in the vicinity of ledge 82) may be minimized.

Displays such as display 14 of FIG. 8 and other displays 14 for device 10 may have an optional display cover layer such as display cover layer 110. Display cover layer 110 may be formed from a layer of clear glass, a layer of transparent plastic, a layer of transparent ceramic, or other transparent material. The thickness of display cover layer 110 may be, for example, 0.1 to 5 mm (as examples).

If desired, optically clear adhesive such as adhesive 104 may be used to attach display cover layer 110 to the outermost surface of upper polarizer 54. When display cover layer 110 is attached to the layers of display 14 in this way, display cover layer 110 may exhibit a reduced likelihood of cracking during use of device 10, allowing the thickness of display cover layer 110 to be reduced. Display cover layer 110 may, if desired, be formed from a relatively hard material (e.g., glass) to resist scratching. Black masking layers 90 may be formed around the periphery of display cover layer 110 to block internal device structures such as driver ledge 82 from view by a user of device 10.

Figure 9:
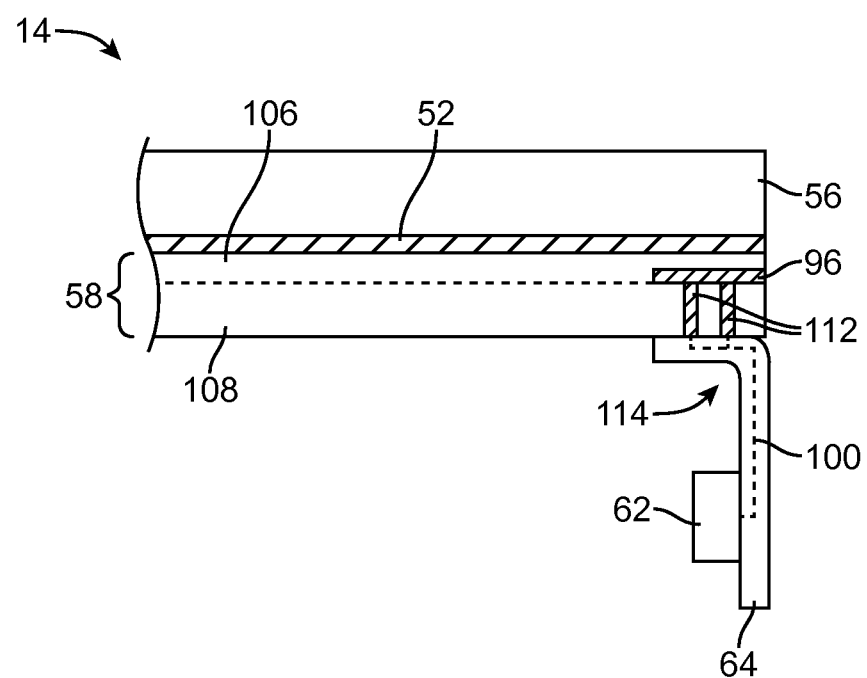
FIG. 9 is a cross-sectional side view of an illustrative display in which through vias pass from the upper surface to the lower surface of the thin-film-transistor layer and in which a display driver circuit is coupled to the vias using a flexible printed circuit in accordance with an embodiment of the present invention.

If desired, via structures may be used to reduce or eliminate the need for ledge 82 on thin-film-transistor layer 58. An illustrative configuration for display 14 in which the width of the inactive border for the display has been minimized by eliminating thin-film-transistor ledge 82 is shown in FIG. 9. As shown in FIG. 9, vias 112 may be formed between the upper and lower surfaces of thin-film-transistor layer 58. When routing signals through thin-film-transistor layer 58 in this way, ledge 82 may be eliminated.

Vias 112, which may sometimes be referred to as via structures, metal vias, or through vias, may be used to connect conductive lines in thin-film-transistor circuitry 106 such as conductive lines 96 to the circuitry of flexible printed circuit 64 (e.g., to conductive lines in flexible printed circuit such as conductive lines 100). Vias 112 may include holes that pass through substrate 108 and metal or other conductive material that fully or partly fills the holes. Solder, conductive adhesive, or other conductive materials may be used to couple the metal of vias 112 to the metal of conductive lines 100 in flexible printed circuit 64. Solder or other conductive materials may also be used in mounting driver circuitry such as display driver integrated circuit 62 to traces 100 of flexible printed circuit 64.

Flexible printed circuit 64 may include one or more bends such as right-angle bend 114 of FIG. 9. With the illustrative configuration of FIG. 9, flexible printed circuit 64 may have a portion that lies flat on the lower surface of substrate 108 and a portion that extends away from substrate 108 at a perpendicular angle (e.g., vertically downward in the arrangement of FIG. 9). This type of arrangement may allow display driver integrated circuit 62 to be mounted along the inner surface of a housing sidewall in housing 12 of device 10.

Vias 112 may be formed by drilling openings in thin-film-transistor substrate 108 (e.g., using laser etching or other hole formation techniques). Following the formation of openings in thin-film-transistor layer substrate 108, metal or other conductive material may be formed within the openings (e.g., using physical vapor deposition, chemical vapor deposition, electrochemical deposition, or other suitable fabrication techniques). If desired, vias 112 may be formed by embedding metal wires within thin-film-transistor layer 108 during glass formation operations.

Figure 10:
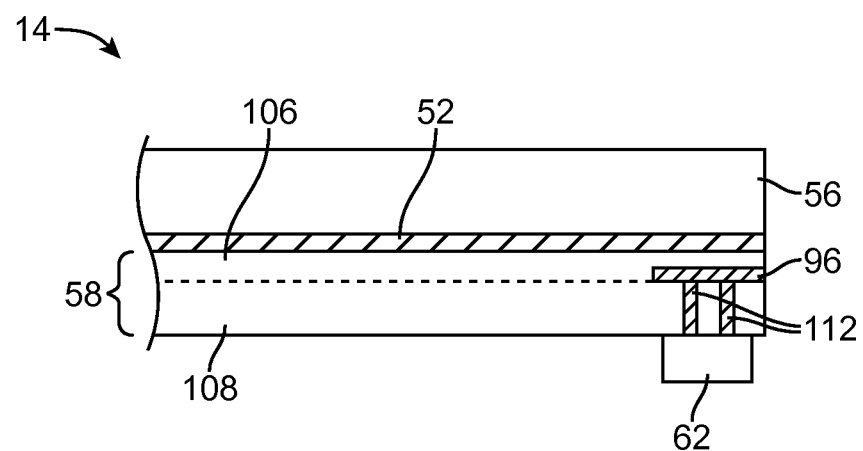
FIG. 10 is a cross-sectional side view of an illustrative display in which through vias pass from the upper surface to the lower surface of the thin-film-transistor layer and in which a display driver circuit is mounted to the vias on the lower surface in accordance with an embodiment of the present invention.

As shown in FIG. 10, display driver integrated circuit 62 may be mounted directly to the lower surface of thin-film-transistor substrate layer 108. Solder, conductive adhesive, or other conductive material may be used in interconnecting the circuitry of display driver integrated circuit 62 to the metal of vias 112. Metal pads may be formed on the lower surface of substrate 108 (e.g., on vias 112 or connected to vias 112) and/or on display driver integrated circuit 62. Solder, conductive adhesive, or other conductive material may be interposed between the metal pads on substrate 108 and on display driver integrated circuit 62.

The foregoing is merely illustrative of the principles of this invention and various modifications can be made by those skilled in the art without departing from the scope and spirit of the invention.

What is claimed is:

1. A display having an active area surrounded by an inactive border region, the display comprising:
   a color filter layer;
   a thin-film-transistor layer having thin-film-transistor circuitry and having a substrate with first and second opposing surfaces, wherein the thin-film transistor circuitry is formed on the first surface;
   a layer of liquid crystal material interposed between the color filter layer and the thin-film transistor layer; and
   a display driver integrated circuit mounted on the second surface, wherein the color filter layer overlaps the display driver integrated circuit in the inactive border region of the display, wherein the substrate has conductive vias that pass vertically through the substrate from the first surface to the second surface and that couple the thin-film-transistor circuitry to the display driver integrated circuit.

2. The display defined in claim 1 wherein the substrate comprises glass and wherein the vias comprise wires embedded in the glass.

3. The display defined in claim 1 wherein the substrate comprises glass and wherein the vias comprise laser-drilled holes in the glass.

4. The display defined in claim 1 wherein the substrate comprises glass.

5. A display, comprising:
   a color filter layer;
   a thin-film-transistor layer having thin-film-transistor circuitry and having a substrate with first and second opposing surfaces, wherein the thin-film transistor circuitry is formed on the first surface;
   a layer of liquid crystal material interposed between the color filter layer and the thin-film transistor layer;
   a flexible printed circuit having a first portion that is mounted to the second surface and a second portion that extends away from the second surface, wherein the first and second portions are connected by a bent portion of the flexible printed circuit; and
   a display driver integrated circuit mounted on the second portion of the flexible printed circuit, wherein the substrate has conductive vias that pass vertically through the substrate from the first surface to the second surface and that couple the thin-film-transistor circuitry to the flexible printed circuit.

6. The display defined in claim 5 wherein the second portion extends away from the second surface at a perpendicular angle.

7. The display defined in claim 6 wherein the substrate comprises glass.

8. The display defined in claim 5 wherein the substrate comprises glass and wherein the vias comprise laser-drilled holes in the glass.

9. The display defined in claim 5 wherein the substrate comprises glass.

10. The display defined in claim 9 wherein the vias comprise wires embedded in the glass.

11. A display, comprising:
    a color filter layer;
    a thin-film-transistor layer having thin-film-transistor circuitry;
    a layer of liquid crystal material interposed between the color filter layer and the thin-film transistor layer, wherein the thin-film-transistor layer has a ledge region that is uncovered by the color filter layer;
    a display driver integrated circuit; and
    wire bonding wires that extend between the thin-film-transistor circuitry in the ledge region and the display driver integrated circuit, wherein each wire bonding wire forms a wire bond connection with a conductive trace on the thin-film-transistor layer, wherein the thin-film-transistor layer has a substrate with upper and lower surfaces, wherein the thin-film-transistor circuitry is formed on the upper surface, wherein the display driver integrated circuit is mounted on the lower surface, wherein the substrate has a conductive line on the lower surface, and wherein at least a portion of the conductive line is interposed between the display driver integrated circuit and the lower surface.

12. The display defined in claim 11 wherein the display driver integrated circuit is electrically connected to the conductive line on the lower surface.

13. The display defined in claim 11 further comprising a black masking layer interposed between the color filter layer and the thin-film-transistor layer in an inactive border region.

14. A display, comprising:
    a color filter layer;
    a thin-film-transistor layer having thin-film-transistor circuitry;
    a layer of liquid crystal material interposed between the color filter layer and the thin-film transistor layer, wherein the thin-film-transistor layer has a ledge region that is uncovered by the color filter layer;
    a flexible printed circuit;
    a display driver integrated circuit mounted on and electrically connected to a conductive trace on the flexible printed circuit; and
    a wire bonding wire the extends between the thin-film-transistor circuitry in the ledge region and a first wire bond connection on the flexible printed circuit to form a signal path between the display driver integrated circuit and the thin-film-transistor circuitry, wherein the wire bonding wire forms a second wire bond connection with a conductive trace on the thin-film-transistor layer, and wherein the conductive trace on the flexible printed circuit extends from the display driver integrated circuit to the first wire bond connection.

15. The display defined in claim 14 wherein the thin-film-transistor layer has a substrate with upper and lower surfaces, wherein the thin-film-transistor circuitry is formed on the upper surface, and wherein the flexible printed circuit includes at least a portion that is mounted on the lower surface.

16. The display defined in claim 15 further comprising a black masking layer interposed between the color filter layer and the thin-film-transistor layer in an inactive border region.

* * * * *